United States Patent [19]

Burghart et al.

[11] 3,775,579

[45] Nov. 27, 1973

[54] METHOD AND APPARATUS FOR REPAIRING PRINTED CIRCUITS

[75] Inventors: Anthony V. Burghart, Endicott; David E. Houser, Apalachin; John E. Kieffer, Endwell; George A. Wallace, Endicott, all of N.Y.

[73] Assignee: International Business Machines Corporation, Armonk, N.Y.

[22] Filed: May 30, 1972

[21] Appl. No.: 257,593

[52] U.S. Cl. ................ 219/85, 29/401 R, 29/497.5, 219/86, 219/91, 228/6

[51] Int. Cl. .............................................. B23k 1/02

[58] Field of Search ................ 219/85, 86, 91, 111, 219/116; 29/625, 626, 628, 401, 497.5, 498; 228/6, 19

[56] References Cited

UNITED STATES PATENTS

| | | | |
|---|---|---|---|
| 3,735,911 | 5/1973 | Ward | 29/401 |
| 3,263,057 | 7/1966 | Couti | 219/85 X |
| 3,125,906 | 3/1964 | Johnson | 29/497.5 X |

*Primary Examiner*—Bruce A. Reynolds
*Attorney*—G. R. Gugger et al.

[57] ABSTRACT

A method and apparatus for repairing an open or void in a printed circuit line on a printed circuit board wherein the board is positioned with the open underneath a bonding head and metallic ribbon material is positioned over the open, thermal compression bonded to the circuit line on one side of the open, cut to length, and then thermal compression bonded to the circuit line on the other side of the open.

11 Claims, 11 Drawing Figures

METHOD AND APPARATUS FOR REPAIRING PRINTED CIRCUITS

BACKGROUND OF THE INVENTION

A common problem in the manufacture of printed circuit conductors or lines on insulating boards is the occurrence of defects in the circuit lines. This problem arises in the manufacture of the conductor pattern by a process of chemical etching or metallic deposition in which the configuration of the conductors ultimately produced is dependent during the manufacturing process upon the integrity and reliability of a resist of a masking material. For example, in the manufacture of etched components, an etch resist is applied to the insulating board generally in the form of an ink which protects a copper sheet thereunder from the action of an etching solution. In the manufacture of electroplated components, the resist is in the form of a mask which obscures all portions of the board except the areas in which conductors are actually to be deposited. In still another process, the conductors may be formed by an electroless deposit of copper upon an ink pattern printed on a board and having the configuration of the desired conductor pattern.

In the manufacturing processes described above and in variations of those processes, it frequently occurs that portions of the resist, the mask, or the ink pattern become inoperative at some stage of manufacture. This oftentimes causes complete opens or voids in the conductors or circuit lines. Defects of this type render at least portions of the circuit board inoperative and unless repaired necessitate scrapping of the board. In most cases it is more economical to repair the circuit board than it is to scrap the board and the repair is generally made by covering the open with a piece of metallic ribbon material and bonding the material to the circuit line on each side of the open. In the past, this has been accomplished by using a microscope and locating the circuit board, by either hand moving it or using a conventional *x-y* table, to position the open underneath a bonding head. The board was then either pinned in place or clamped by some form of weight or pressure bearing down on the top surface of the board. Next, the operator would hand feed a length of the ribbon material and manually locate the ribbon in the proper position over the open. Then, while the operator held the ribbon in place by a pair of tweezers or the like, a bonding cycle was carried out to bond the end of the ribbon to the circuit line on one side of the open. The operator would then relocate and reclamp the circuit board and carry out another bonding cycle to bond the other end of the ribbon to the circuit line. After the second bond, the ribbon had to be cut by hand and in this operation, it could not be cut close enough to the bond without risking injury to the circuit line. So it was cut to leave enough material for the operator to grab with a pair of tweezers and bend the material back and forth on itself so that it would break clean near the bond and not leave a tail.

It was found that this procedure presented a number of problems. The amount of hand manipulation required made the operation slow and cumbersome and the results obtained were heavily dependent upon the skill of the operator. The width of printed circuit lines generally falls in the range of 0.003 to 0.015 inch and the repair ribbon would have a width slightly less than the circuit line being repaired. Working in this range, the application of the ribbon to the circuit line by hand with any degree of accuracy proved to be both time consuming and difficult and inconsistent and unacceptable bonds resulted. Also, the printed circuit boards, which may be copper foil on epoxy glass laminate with a thickness range of 0.015 to 0.080 inch, have a tendency to develop warpage and the means used to clamp the board did not always adequately flatten out the warpage. The presence of warpage would effect the focal image on the microscope and would result in inaccurate positioning of the board. It was also found that when handling circuit boards of different thickness it was necessary to make compensating changes in, for example, microscope focus, bond tip pressure, bond current, etc.

SUMMARY OF THE INVENTION

The present invention overcomes the above-mentioned shortcomings by providing improved apparatus whereby the repair procedure is made more automatic, is easier to carry out, and is both faster and more reliable. The improved apparatus includes a novel arrangement for clamping the circuit board to a small *x-y* table and the table is provided with fine tuning controls which enable the circuit board to be accurately located to properly position the circuit line defect under the bonding tips. In the arrangement, a pressure disc is moved up against the underside of the circuit board to clamp the board up against a clamp plate which is fixed against vertical movement. Clamping from underneath the circuit board provides the advantage that boards of different thickness can be handled without having to compensate because the top surface of the board to be bonded will always be the same distance from the tips of the bonding head. Also, the pressure disc is effective to flatten out any warpage in the board in the immediate area surrounding the defect to be repaired. The fine tuning controls for the *x-y* table comprise a pair of thumb operated levers which have rod and ball joint connections with the table to provide fine control of its movement.

The improved apparatus also includes a novel ribbon feed and cutoff mechanism which carries out this operation automatically, thus eliminating the tedious hand manipulation previously required. The mechanism includes a pair of movable clamp jaws into which the repair ribbon is threaded. A pair of cutoff blades, one of which is rotatable, are mounted in the jaw assembly. Means are provided to pivot the jaw assembly down into position on the board to be repaired and camming means are provided which function to move the jaw assembly forward to feed the proper amount of ribbon material into position over the circuit defect. After the first bonding operation, the camming means are actuated to cause the jaw assembly to retract and take a new bite on the ribbon material while it is being held in position by the first bond and also the cutting blade is rotated to a close position cutting the ribbon material to the proper length for the next defect and leaving the already bonded ribbon segment with the proper length to bridge the defect being repaired and in position for the second bonding operation. This ribbon feed and cutoff mechanism results in much better accuracy and repeatability in the positioning of the ribbon than could heretofore be obtained. It also has the advantage that it can handle different widths of ribbon material.

In addition, the apparatus of the present invention embodies a novel and improved means for controlling the bond cycle and also improved structure for supporting the bond tips. In bonding units on the market adapted for the repair of circuit lines, the bond head which supports the bond tips is spring driven into the bond position and the bond cycle is controlled by limit switches actuated by the movement of the head. The mechanism involved comprises cams, mechanical slides, and springs which created a number of problems which resulted in inconsistent bonds and down time for mechanical adjustments. In the present apparatus, the bond head is driven by an air cylinder and the triggering of the bonding current is a function of the bond tip pressure. When the bond tips make contact with the circuit board at the start of the bonding cycle, the air pressure in the air cylinder increases and when it reaches a preset value to produce the required tip pressure, a first pneumatic pressure switch closes to initiate the current flow. When the air pressure increases to a slightly higher pressure, a second pneumatic pressure switch closes to return the head to the up position to complete the cycle. This arrangement provided a more simple and trouble free control mechanism which consistently produced good bonds.

A problem encountered with the spring driven tip support structure was tip bounce and also the structure would deform under the spring load causing the bond tips to push the ribbon material off of the circuit line. To overcome this, the present support structure was made stiffer and in the form of a cantilever arm which is pivoted by the air cylinder. Suitable counter balance spring means and shock absorber means are provided for the arm to iron out surges and the arm will move at an even rate to hold the repair ribbon in position on the circuit line during bonding and no tip bounce.

The present apparatus has resulted in less scrap of circuit boards due to inaccurate alignment and, as previously mentioned, has greatly speeded up the operation. Heretofore, the rate of repair has been in the order of 10 circuit opens per hour and this has now been increased to 90 per hour.

It is, then, a primary object of this invention to provide a novel and improved semiautomatic method for repairing an open or void in a printed circuit line on a printed circuit board.

A further object of the present invention is to provide a novel and improved apparatus for repairing an open or void in a printed circuit line on a printed circuit board.

A still further object of the present invention is to provide a novel method and apparatus wherein a piece of ribbon material is thermal compression bonded at each end to a circuit line on a printed circuit board to repair an open in the line.

A further object of the present invention is to provide apparatus for making bonding repairs to circuit line defects on a printed circuit board which includes a novel mechanism for clamping against the underside of the board and for *x-y* adjustment of the board to the proper position for bonding the defect.

Another object of the present invention is to provide apparatus for bonding each end of a piece of ribbon material to a circuit line on a printed circuit board to repair an open in the line and which includes a novel ribbon feed and cutoff mechanism for automatically feeding ribbon material into position over the open and for cutting it to the proper length.

Still another object of the present invention is to provide bonding apparatus having bonding tips which are moved against ribbon material to bond it to a printed circuit line and which includes novel means for controlling the bonding cycle in accordance with the bond tip pressure.

Yet another object of the present invention is to provide bonding apparatus having bonding tips which are moved against ribbon material to bond it to a printed circuit line and which includes novel means for supporting and moving the bonding tips to prevent tip bounce and movement of the ribbon during bonding.

A still further object of the present invention is to provide apparatus for bonding each end of a piece of ribbon material to a circuit line on a printed circuit board to repair an open in the line and which includes a slideable gripper jaw and cutoff blade mechanism which is repetitively operable to slide in one direction to position ribbon over the open for a first bonding operation after which it is operable to retract to take a new bite on the ribbon while it is being held in position by the first bond and to cut the ribbon to proper length for the next open, leaving the already bonded ribbon segment with the proper length to bridge the open being repaired.

The foregoing and other objects, features and advantages of the invention will be apparent from the following more particular description of a preferred embodiment of the invention as illustrated in the accompanying drawings.

DESCRIPTION OF A PREFERRED EMBODIMENT

Figures 5, 10:
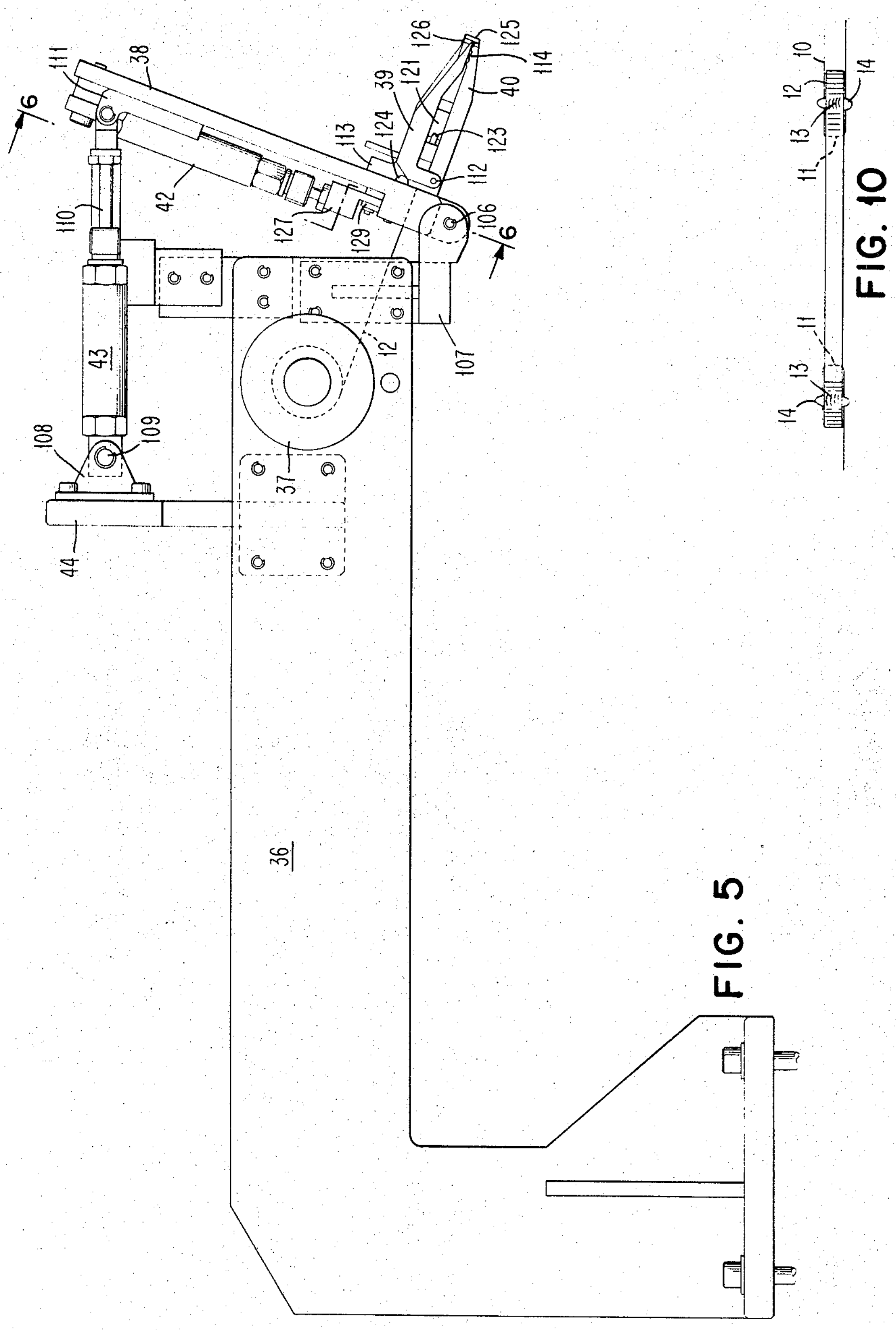
FIG. 5 is an elevational view of the ribbon feed and cutoff mechanism.
FIG. 10 is a schematic diagram illustrating a circuit repair made by the apparatus of FIG. 1.

Referring to FIG. 10 first, there is illustrated in exaggerated size a typical circuit repair made by the apparatus of the present invention. The printed circuit line 10, for example, may be copper foil having a width of 0.005 inch and an open or void 11 in the line having a length of 0.125 inch. The ribbon repair material 12 may be silver phosphate clad copper ribbon which, for the example shown, would have a width of 0.0045 inch and a thickness of 0.001 inch. The ribbon segment 12 bridges the open and is bonded at each end to the circuit line, as represented by the so-called nuggets 13. The nugget is the actual bond which forms between the bonding tips of the bonding apparatus. There is also formed along with the bond nugget some resin flow 14 which is melt from the epoxy glass board on which the circuit lines are disposed. It is preferred that the ends of the ribbon segment extend beyond the bond nugget by some 0.005 to 0.010 inches.

Figure 1:
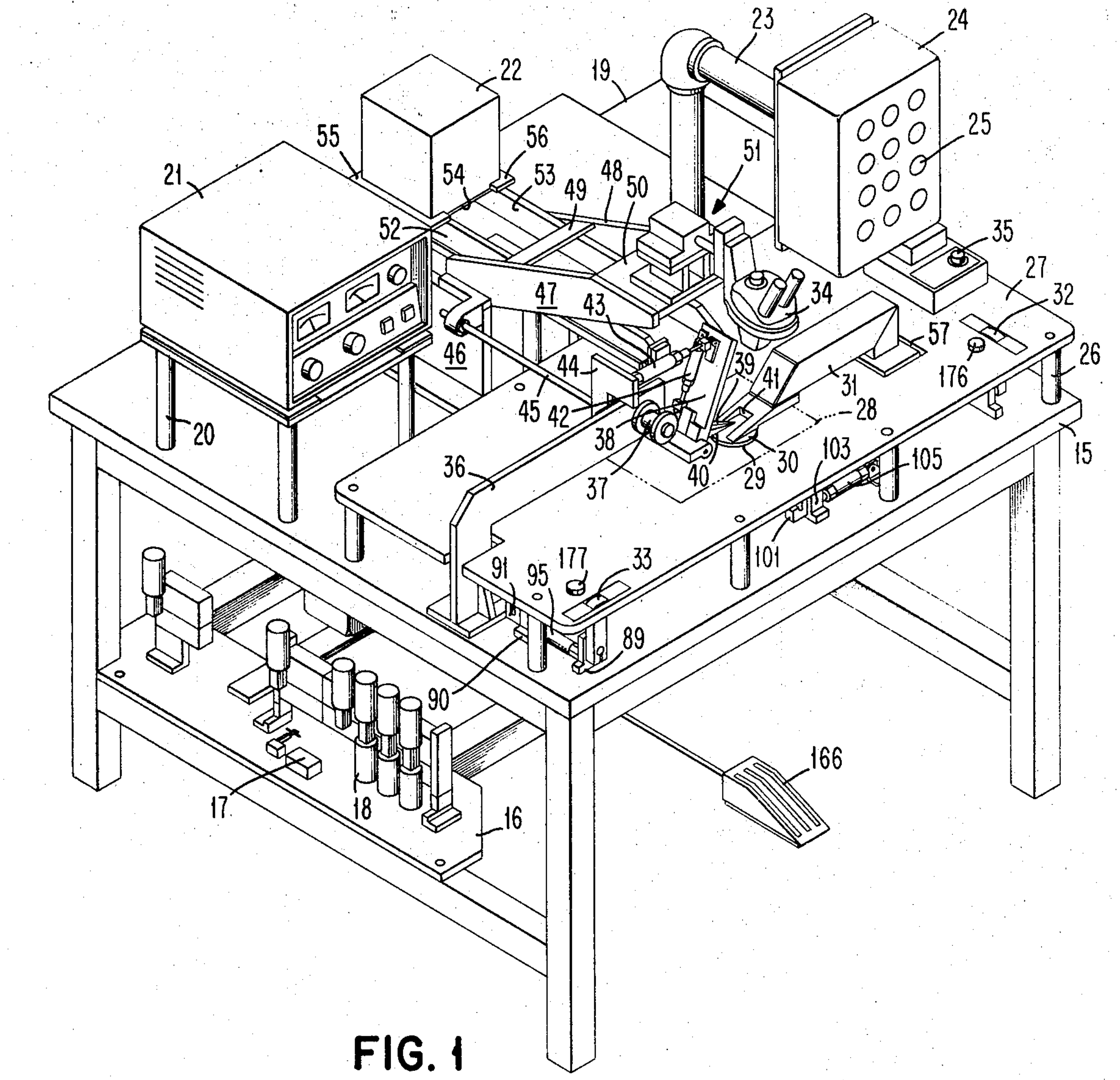
FIG. 1 is an isometric view showing the general assembly of the circuit line bonding apparatus of the present invention.

Referring now to FIG. 1, the general assembly of the apparatus for making the circuit repair comprises a conventional base table 15 having a shelf portion 16 underneath on which are mounted various pneumatic pressure switches 17 and solenoid valves 18. Attached to one side of the table is an electrical enclosure box 19 which houses various electrical components. Mounted on top and toward the back of the table via standoff legs 20 is a power supply unit 21 which may be, for example, the Model 1–124–03, 110 volt AC, 1.5 amp. supply manufactured by the Unitek Corporation. The power supply feeds an output transformer 22 mounted nearby and this transformer may be, for example, the Unitek Model 10–105–01 transformer. Overhanging the table and mounted to an electrical conduit pipe 23 is a control box 24 which houses various indicator lamps and switch buttons 25.

Mounted on top and at the front of the base table by way of standoff legs 26 is a support plate 27 on which the circuit board 28 to be repaired is positioned. The board is positioned over a circular opening 29 in the plate and a pressure disc 30 extends through the opening and is operable to clamp the circuit board against a clamp arm 31. The pressure disc 30 functions as a small *x-y* table to accurately position the circuit board and, as will be further described, fine tuning control mechanism operated by way of thumb levers 32 and 33 is provided to control the *x-y* movement. To facilitate accurately locating the circuit defect on the board into the proper position for bonding, there is provided a suitably mounted 30 power microscope 34 and an illuminator 35 for controlling a suitable table lamp, not shown. The illuminator may be, for example, the Model 31–33–53, 115 volt, 60 cycle adjustable transformer manufactured by the Bausch and Lomb Company and the microscope may be the Bausch and Lomb Model 31–35–30.

Fastened to the top of the base table is an L-shaped arm 36 which extends out over the plate 27 and supports a repair ribbon supply spool 37 and a pivot plate 38 which are part of the ribbon feed and cutoff mechanism. The main portion of the feed and cutoff mechanism, which will be described later, is supported on the pivot plate and includes as a part thereof upper and lower ribbon clamp jaws 39 and 40 which are movable in the U-shaped opening 41 in the end of clamp arm 31. The pivot plate 38 supports an air cylinder 42 which operates the feed and cutoff mechanism. The plate is also attached to an air cylinder 43 which is supported on a plate 44 fastened to the arm 36. Cylinder 43 functions to pivot the assembly into operating position. The positioning of the ribbon onto the circuit line being repaired must be precise and accurate and to prevent the mechanical structure involved from incuring any undesirable motion due to vibration or the like, it is further solidly anchored by means of a stiffener rod 45 fastened between the arm 36 and a support plate 46.

Mounted on the base table is a pair of parallel overhead arms 47 and 48 having a connecting cross bar 49. The ends of the arms are joined by a plate 50 on which is mounted a riser support block assembly 51 to which the microscope 34 is attached. Operating between the overhead arms is another pair of parallel arms 52 and 53 which are pivotally mounted at the rear of the table. Mounted on the back ends of these arms is a plate 54 and a pair of locating blocks 55 and 56 which support the output transformer 22. As will be seen, the front ends of these arms support the bond head and bonding tips and the arms are pivoted to move the bonding tips down into bonding position.

Figure 2:
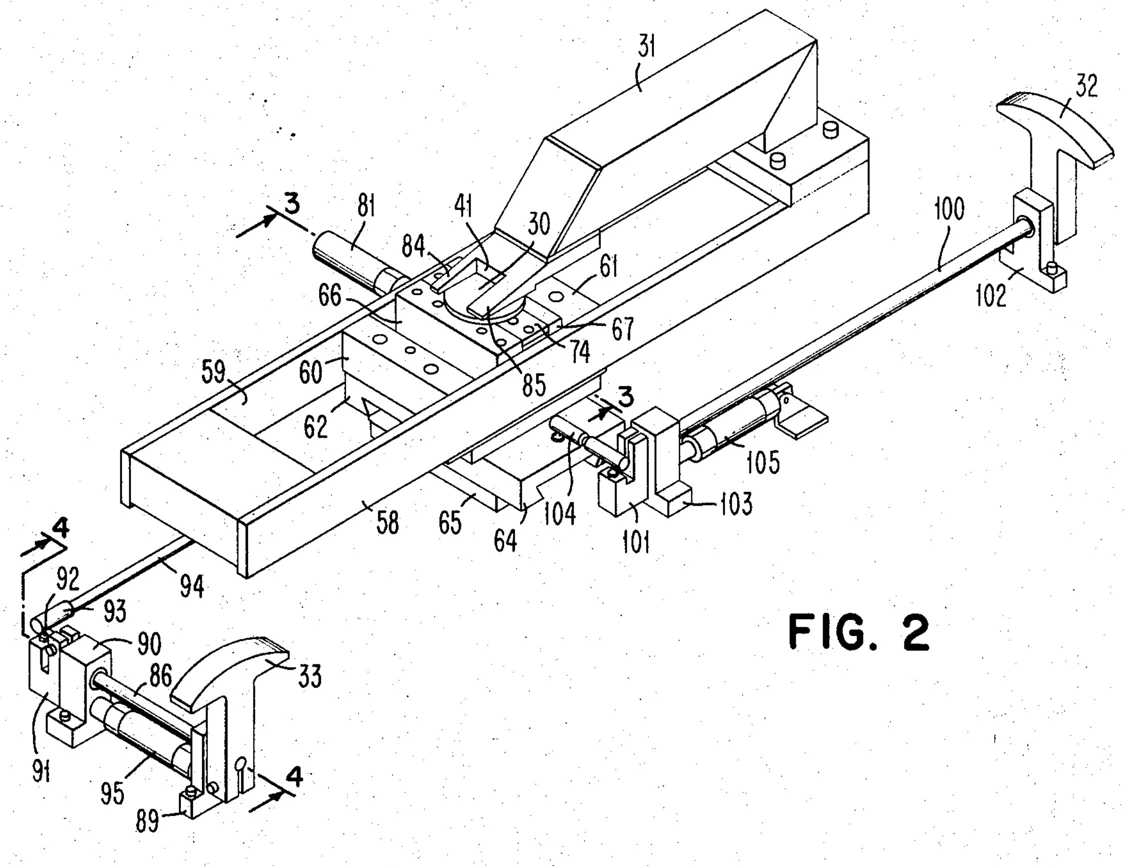
FIG. 2 is an assembly view showing the circuit board clamping and *x-y* positioning mechanism.
Figure 3:
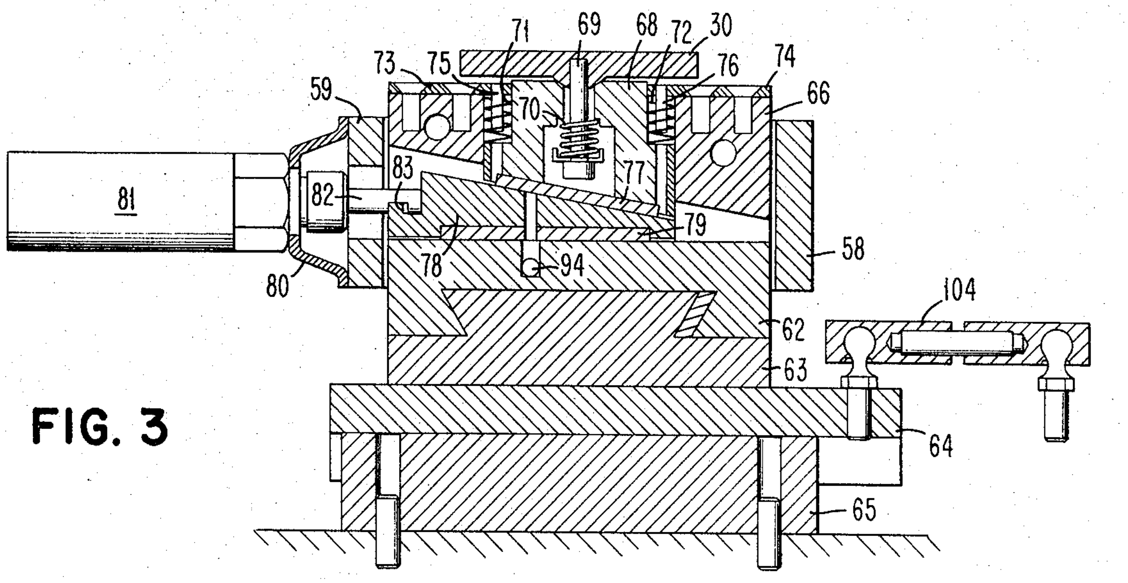
FIG. 3 is a sectional view taken on line 3—3 of FIG. 2 and showing details of the circuit board clamping mechanism.
Figure 4:
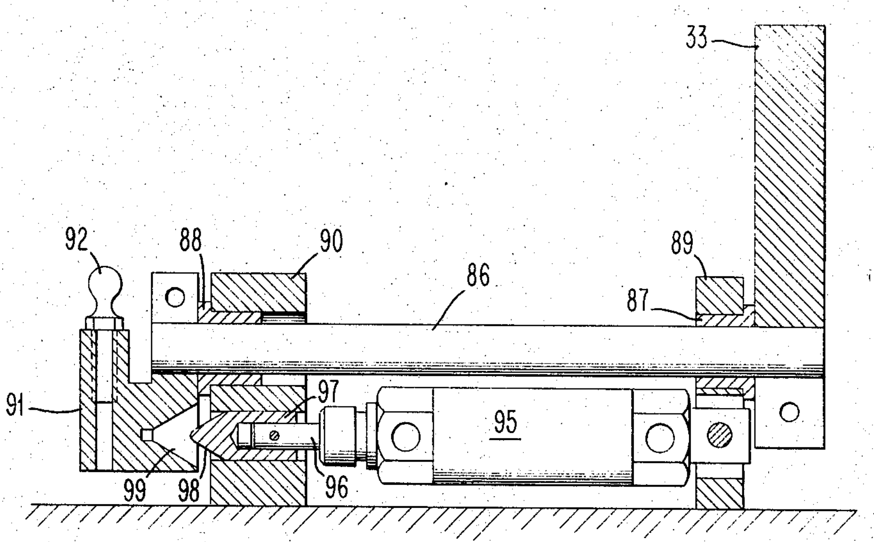
FIG. 4 is a sectional view taken on line 4—4 of FIG. 2 showing the *x-y* positioning controls for positioning the circuit board.

Turning now to FIGS. 2, 3 and 4, the circuit board clamping and positioning mechanism will be described in more detail. The clamp arm 31 has a portion which extends down through an opening 57 (FIG. 1) in the plate 27 and is attached to a support arm assembly (FIG. 2) having parallel arms 58 and 59 which extend along near the underside of the plate 27. Integral with the arm assembly is a pair of blocks 60 and 61 which are fastened to an upper dovetail slide block 62. As shown in FIG. 3, block 62 is slideably mounted for movement along a dovetail block 63 and block 63 is fixed to a lower dovetail slide block 64 which is slideably mounted for movement along a dovetail block 65. Block 65 is fixed to the table 15 and serves to support the assembly.

Also fastened to the upper slide 62 is a housing block 66 (FIG. 2) and fastened to this block is a side cover plate 67, the housing block and plate serving to retain the pressure disc 30 and its actuating mechanism. As shown in FIG. 3, mounted in a cavity in the housing is a lift block 68 which has a cavity for receiving the stem portion 69 of the pressure disc. The pressure disc is seated and retained in a dished-out portion on the top surface of the lift block by means of a compression spring 70 mounted between a shoulder on the stem 69 and a shoulder in the cavity. The lift block 68 is retained in the housing cavity by means of compression springs 71 and 72 which extend between shouldered surfaces in the lift block and housing and the spring retainer plates 73 and 74 fastened to the top of the housing. Pins 75 and 76 extend down from the retainer plates to receive the springs. Mounted on the bottom of the lift block is an oilite bearing plate 77 which seats on the top surface of a movable wedge block 78. The bottom surface of the wedge block has mounted therein an oilite bearing plate 79 which sits on the upper slide block 66. Mounted to the side of arm 59 by way of a flange 80 is an air cylinder 81 which is connected to a suitable source of air pressure, not shown. The piston rod of the air cylinder includes a hook member 82 which extends through the arm and housing and fits into a notch 83 in the wedge block. The air cylinder and wedge block are shown in retracted position and operation of the cylinder will extend the hook member thereby pushing the wedge block and the top surface of the block acting against the oilite plate 77 will cam the lift block and pressure disc upward and a printed circuit board positioned over the disc will be clamped tightly against the finger portions 84 and 85 (FIG. 2)

at the end of clamp arm 31. Upon retraction of the air cylinder and wedge block, the lift block and pressure disc will be returned downward to their normal position by the springs 70, 71 and 72.

As was previously mentioned, the pressure disc 30 also functions as an *x-y* table to position the clamped board and accurately locate the circuit defect in position for bonding. For this purpose, fine tuning mechanisms controlled by the thumb levers 3 and 33 are provided to move the slide blocks 62 and 64. Referring to FIGS. 2 and 4, the thumb lever 33 is fastened to the end of a shaft 86 which is rotatively supported in bushings 87 and 88 mounted respectively in support blocks 89 and 90 which are fastened to the base table 15 in the front left-hand corner of the machine. Fastened at the other end of the shaft 86 is a ball joint block 91 which carries a ball connector 92. The ball connector 92 makes a ball joint connection with a socket member 93 fastened at one end of a ball joint rod 94. The other end of rod 94 has a similar ball joint connection to the upper slide block 62, as indicated in FIG. 3, and it can be seen that movement of the thumb lever 33 in either direction will rotate shaft 86 accordingly and, through the ball joint connections and rod 94, the upper slide block 66 is given the desired movement along the dovetail of fixed block 63. As a result, the clamp arm assembly and pressure disc which are supported by the slide block 66 are moved accordingly to position the circuit board along an *x—x* axis.

Means are provided for re-setting the positioning mechanism prior to processing another circuit board. As shown in FIG. 4, an air cylinder 95 is mounted at one end to the support block 89. At the other end, the piston rod 96 of the cylinder has attached thereto a cam member 97 which is slideably mounted in the support block 90. The cam has a conical camming surface 98 which normally is aligned on center with a conical recess 99 in the ball joint block 91. When the thumb lever 33 is actuated to position a board, the recess 99 is thrown out of center alignment with the cam in accordance with the amount the positioning mechanism is adjusted. Prior to handling the next board, air cylinder 95 is operated and the cam member 97 will be extended into the conical recess to cam the ball joint block 91 back onto center alignment. Through the ball joint connections, upper slide block 62 and the clamping mechanism are restored to normal position. The air cylinder will then retract the cam to free the ball joint block for the next operation.

As shown in FIG. 2, the thumb lever 32 operates the same kind of fine tuning mechanism, as the one just described, to position the circuit board along the *y—y* axis. Lever 32 operates the rod 100 and ball joint block 101 mounted in support blocks 102 and 103. Movement of ball joint block 101 is transmitted to the lower slide block 64 by way of the ball joint connection 104 and the slide block will be adjusted along the dovetail on the fixed block 65. Since the upper slide block 62 and fixed block 63 are mounted on slide block 64, the clamp arm assembly and pressure disc will be adjusted accordingly for *y—y* positioning. An air cylinder 105 and conical cam mechanism, identical to the one described above, is provided to reset the *y—y* positioning mechanism prior to processing the next board.

The mechanism for feeding, positioning and cutting the repair ribbon will now be described. Turning first to FIG. 5, there is shown the overhead arm 36 to which the ribbon supply spool 37 is rotatively mounted. The pivot plate 38, on which the air cylinder 42 is mounted, is shown mounted on pivot pins 106 carried by a bracket plate 107 fastened to the side of arm 36. The plate 44, which also is fastened to the side of arm 36, carries a bracket 108 to which one end of air cylinder 43 is fastened by means of a pivot pin 109. The piston rod 110 of the cylinder is pinned to a bracket 111 fastened to the pivot plate 38. As shown in FIG. 5, the piston rod is in its operated or extended position to pivot plate 38 clockwise for the purpose of seating the upper and lower ribbon clamp jaws 39 and 40 down lightly onto the surface of the circuit board.

Figure 7:
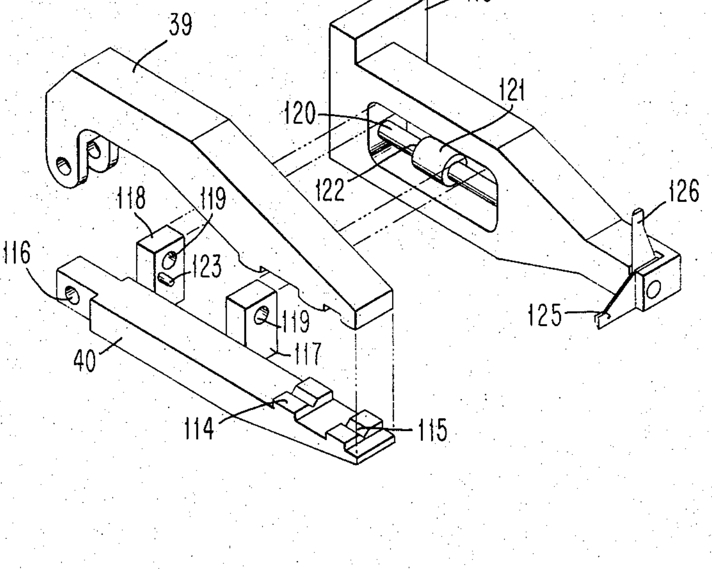
FIG. 7 is an exploded schematic view illustrating the assembly of the ribbon feed clamp jaws, the cutoff blades, and the cam and cam shaft.

The clamp jaws are pivotally attached to each other by a pivot pin 112 and the jaw assembly is mounted for movement along a support block 113 which is fastened to the pivot plate 38. The repair ribbon 12 is threaded between the jaws and is clamped lightly therein by the jaw teeth 114. The mounting and movement of the jaw assembly can best be seen by referring to FIG. 7. The lower jaw 40 has extending partially along its surface a V-shaped groove 115 which receives the ribbon material 12 and the use of such a groove facilitates the handling of different width ribbons. The upper jaw 39 is pivotally mounted to the lower jaw at 116 and attached to the side of the lower jaw are two slide blocks 117 and 118. The slide blocks extend into an opening in the support block 113 and, by way of holes 119, are slideably supported on a cam shaft 120 which is rotatively supported by block 113. Fixed on the cam shaft between the slide blocks is a cam 121 having a cam surface 122 for coaction with a cam follower pin 123 mounted on the slide block 118. A spring biased plunger 124 (FIG. 5) is provided to urge the jaw assembly and pin to follow the cam surface. Mounted adjacent to the front end of the jaw assembly is a stationary blade 125 and a ribbon cutoff blade 126 which is fastened to the shaft 120.

Figure 6:
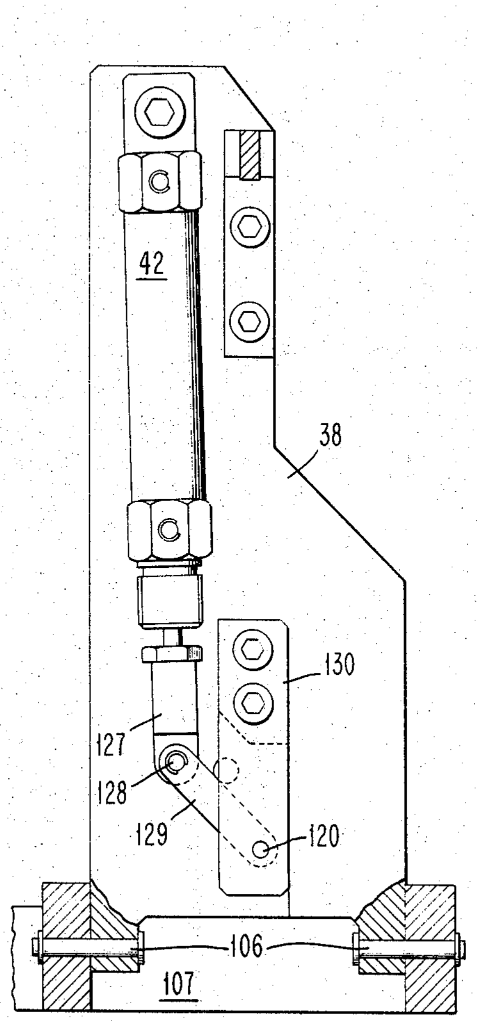
FIG. 6 is a partial view taken on line 6—6 of FIG. 5 and showing the mechanism for rotating the ribbon feed and cutoff cam shaft.

Referring to FIGS. 5 and 6, the mechanism for rotating the cam shaft 120 includes the air cylinder 42. The piston rod of the cylinder has attached thereto a clevis adapter 127 which in turn is secured by a pin 128 to one end of an actuator arm 129. The actuator arm is movable in a keeper block 130 and has its other end secured to the cam shaft 120. Cylinder 42 is shown in its retracted position and operation of the cylinder will extend the piston rod causing the actuator arm to rotate the cam shaft 120 counterclockwise, as viewed in FIG. 6, and as a result the jaw assembly will be cammed forward or to the right, as viewed in FIG. 5, to feed and position the ribbon over the circuit defect. The ribbon material normally extends beyond the jaw and cut-off blade assembly so that this portion of the ribbon is pushed by the jaws into the desired position under the bonding tips. This same rotation of the cam shaft causes the ribbon cutoff blade 126 to rotate to the open position, shown in FIG. 7. After completion of the first bonding operation, air cylinder 42 is retracted causing the cam shaft to be rotated back in the opposite direction. The jaw assembly will be cammed back to take a new bite on the ribbon material while it is being held in position by the first bond and also the cutoff blade 126 will be rotated to a close position cutting the ribbon to proper length for the next defect and leaving the already bonded ribbon segment with the proper length to bridge the defect being repaired.

Figure 8:
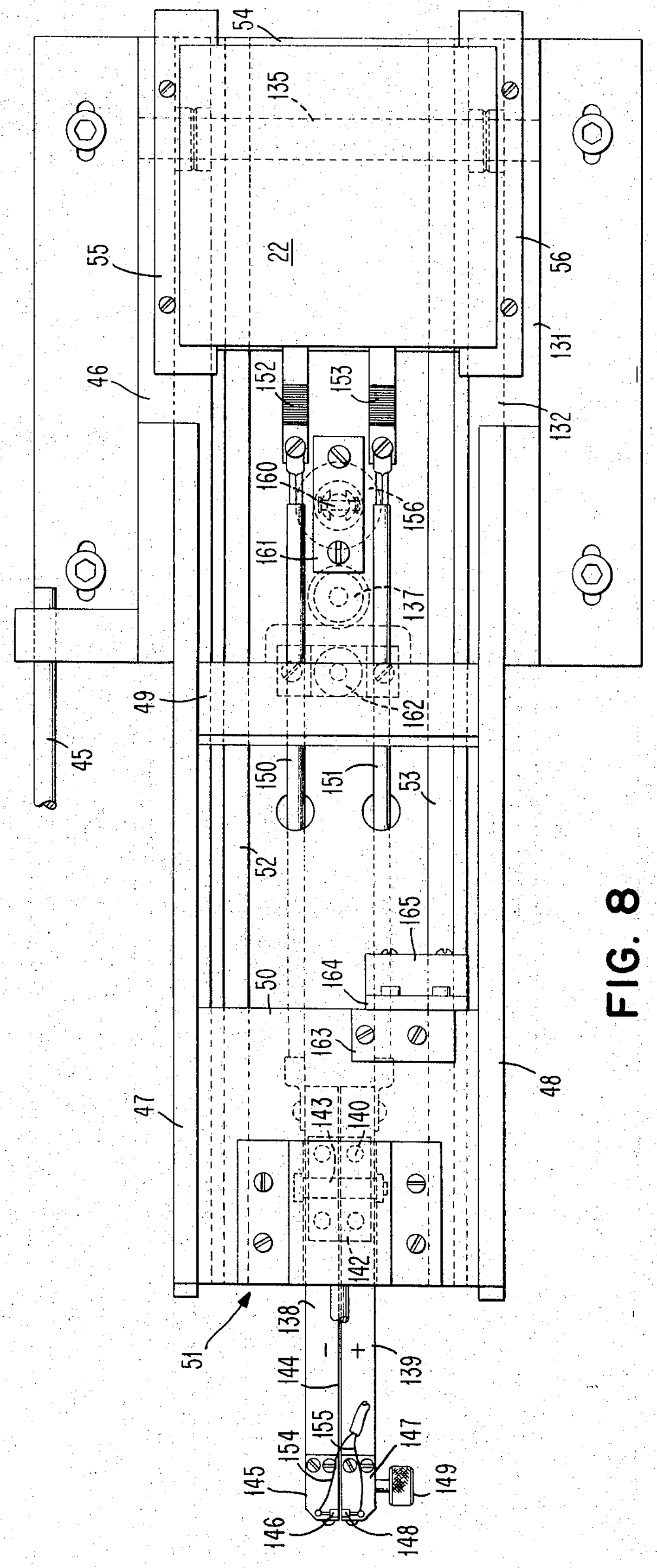
FIG. 8 is a plan view showing the bond head assembly.
Figure 9:
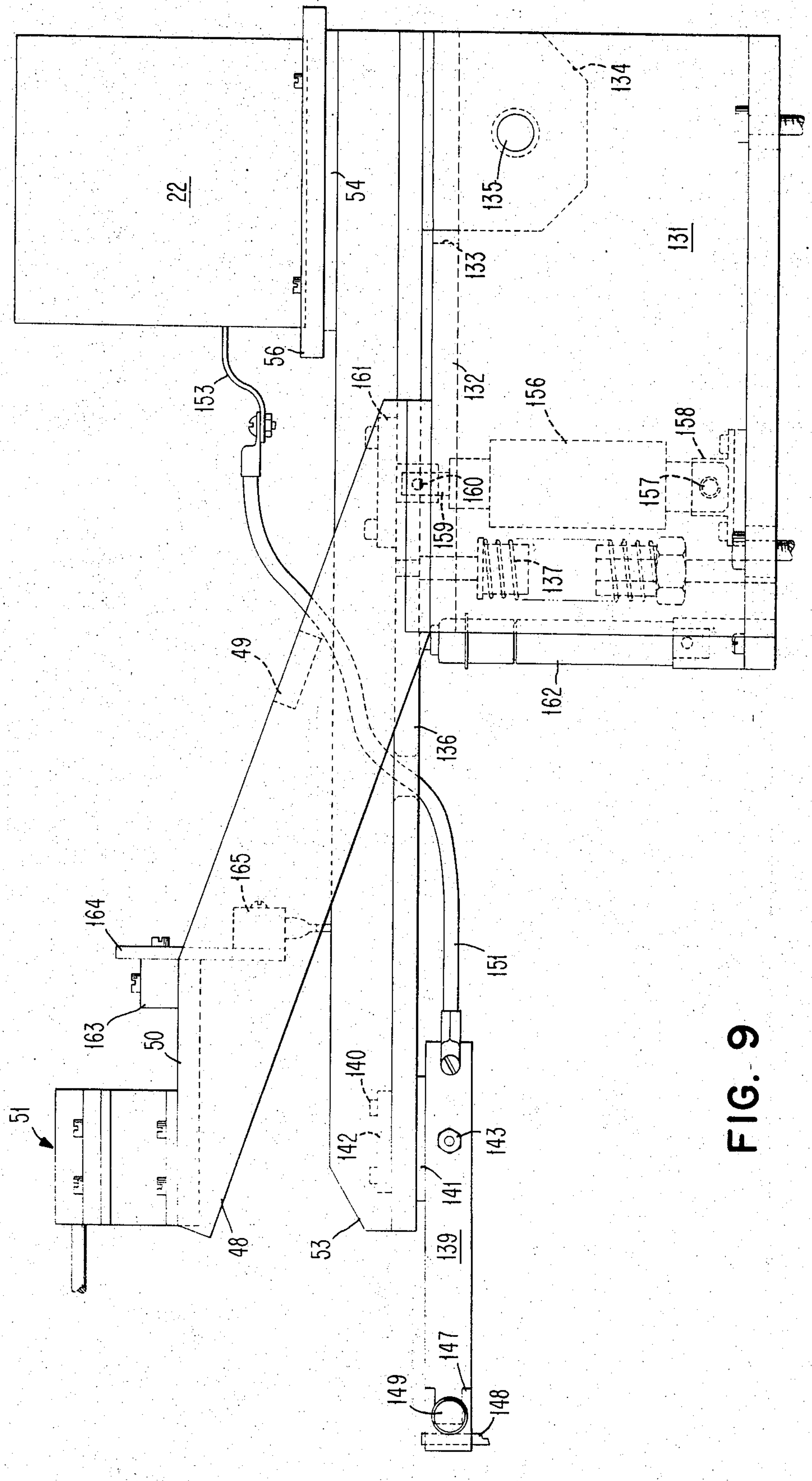
FIG. 9 is a side elevation view of the bond head assembly of FIG. 8.

Referring now to FIGS. 8 and 9, there is shown the bonding head assembly. Bolted to the top and at the rear of the base table are the vertical support plates 46 and 131 and these plates are joined at the top by a welded horizontal support plate 132. Bolted to the top of this plate structure are the overhead arms 47 and 48 which support the riser block assembly 51 and the microscope. The horizontal plate 132 has a cutout portion 133 for receiving a hollow block 134 which is fastened to a pivot shaft 135 journaled in the vertical plates 46 and 131. Block 134 is welded to a plate 136 which in turn is welded to the underside of the arms 52 and 53. As shown, the back ends of arms 52 and 53 support the mounting plate 54, locating blocks 55 and 56, and the transformer 22.

It can be seen that arms 52 and 53 and plate 136 form a solid and stiff swing arm extending out from its pivot shaft and this swing arm is normally retained in a horizontal position, as shown in FIG. 9, by means of a counterbalance spring 137 suitably mounted between the table top and the plate 136 of the arm. Mounted to the front end of the swing arm is the bonding tip assembly which comprises two conductor bars 138 and 139 fastened to the underside of plate 136 by the screws 140. An insulator block 141 is provided between the bars and the plate and another insulator block 142 is provided between the screw heads and the plate. The screws pass through insulating sleeves, not shown, which are mounted in the plate. The conductor bars are fastened to each other by an insulating bushing and bolt 143 and have an insulation spacer 144 positioned between them. Fastened at the front end of conductor bar 138 is a brass holder block 145 in which is mounted the left-hand bonding tip 146 and a similar brass holder block 147 is fastened at the front end of conductor bar 139 and has mounted therein the right-hand bonding tip 148. The brass blocks are also separated by the insulation spacer 144. A screw knob 149 mounted in a phenolic insert, not shown, is provided to adjust the air gap between the bonding tips. If this gap is too narrow, burning could result which would cut the circuit line.

To supply current to the bonding tips to carry out a bonding cycle, there are provided the cable connectors 150 and 151. Cable 150 connects conductor bar 138 to a negative and ground terminal 152 on the output transformer 22 and cable 151 connects the conductor bar 139 to a positive terminal 153 on the transformer. Current flow from terminal 153 through cable 151, conductor bar 139, block 147, the right-hand tip 148, the ribbon repair material, the left-hand tip 146, block 145, conductor bar 138, and cable 150 to terminal 152 will result in a thermal compression bond wherein the heat generated will melt or reflow only the coating on the ribbon material and this is pressed into the copper circuit line to affect a union. The use of thermal compression bonding provides a major advantage over a welding type of operation in that it decreases and/or eliminates heat sensitive materials near the open from being damaged. The time duration of the current flow is proportional to the rate of current flow which is a function of the circuit path impedance. In the present application, for example, using 0.4 volts and a current of 200 amperes, the time duration is typically 8 milliseconds. The duration may vary from 4 to 8 milliseconds for currents of 150 to 200 amperes. Connected to the blocks 145 and 147 and the bonding tips are two leads 154 and 155 which are connected back to the power supply 21 to provide a voltage feedback to control the output voltage.

Referring particularly to FIG. 9, there is provided an air cylinder 156 mounted by way of pivot pin 157 to a clevis support bracket 158 fastened to the table top. The piston rod 159 of the cylinder is attached to a pivot pin 160 suitably mounted in an opening in the plate 136 of the swing arm. A cover plate 161 is provided over the opening. Actuation of the air cylinder will pull the swing arm down about its pivot shaft 135 to bring the bonding tips into contact with the repair ribbon. The swing arm acts against a shock absorber 162 mounted between plate 136 and the table top. The shock absorber functions to iron out surges allowing the swing arm to drop at an even rate and preventing any bounce of the bonding tips against the table. Reverse operation of the air cylinder returns the swing arm back up to its normal horizontal position and against a suitable adjustable backstop, not shown. A mounting block 163 and plate 164, fastened to plate 50, supports a microswitch 165 in abutting relationship with the top of the arm 53. The microswitch is operated by the movement of the swing arm and it functions as an interlock to insure that the swing arm is returned to its up position before the ribbon feed mechanism is operated.

Figure 11:
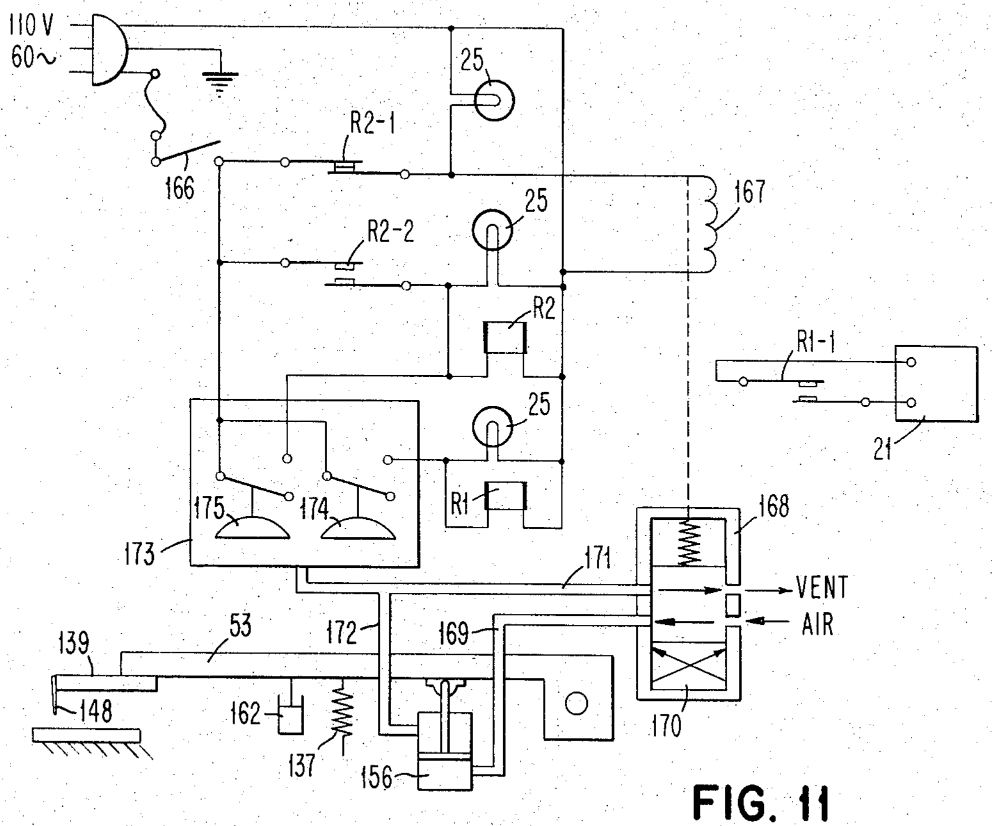
FIG. 11 is a schematic diagram illustrating the pneumatic and electrical controls for controlling the bonding cycle of the apparatus of FIG. 1.

As was previously mentioned, one of the improvements in the present apparatus resides in the use of the bond tip pressure to trigger the bonding current. The pneumatic and electrical controls for this operation are shown in FIG. 11 and will now be described. A bonding cycle is set up by activating a foot switch 166 which results in power being applied to a four-way valve solenoid coil 167 through normally closed relay contacts R2–1. The solenoid 167 is connected to a four-way valve 168 which has an inlet port connected to a suitable source of air pressure and an outlet port vented to the atmosphere. The air is normally transmitted by way of line 169 to the bottom chamber of the air cylinder 156 and the swing arm is held in its up position. Upon energization, solenoid 167 operates a slide spool 170 in the four-way valve to switch the air to lines 171 and 172 for transmission to the top chamber of air cylinder 156. The air is also now transmitted by line 171 to a pressure switch chamber 173. The bottom chamber of the cylinder is now vented through line 169 and the swing arm is pulled down putting the bonding tips in contact with the ribbon and table. With the tips in contact with the table, the air pressure will increase and when it reaches a preset value to produce the required tip pressure for bonding of, for example 15 p.s.i., a first pressure switch 174 in the chamber closes its contacts and power is applied to pick a relay R1. Energization of relay R1 closes its normally open contacts R1–1 to signal the power supply unit 21 to supply current to the tips to start bonding. When the air pressure increases to a slightly higher pressure of 16 p.s.i., a second pressure switch 175 in the chamber closes to pick the relay R2. The closed R2–1 contacts now open to remove power from the solenoid coil 167 and the 4-way valve is operated to switch the air pressure back to the bottom chamber of air cylinder 156 to return the swing arm and tips to their up position. Chamber 173 is now vented to open the contacts of the pressure switches and drop relay R1. Relay R2 will remain energized through the now closed holding contacts R2–2 to prevent a new bonding cycle until the foot switch 166 is released. Various lamps 25 are provided to indicate sequential operation of the circuits.

Referring now to FIG. 1, the operating procedure for making a circuit repair will be summarized. It will be understood that the several solenoid valves, such as indicated at 18, are connected in the system in a conventional manner to effect operation of the various air cylinders. The operator actuates a power-on button on the control box 24 to bring up a suitable supply of air pressure and a reset button is actuated to home all of the air cylinders that are not homed and air cylinders 95 and 105 are operated to their extended position to center the *x-y* table. An inked circle is made around the circuit open and the board is positioned on the pressure disc — *x-y* table 30 and rough located to bring the circled area under the bonding tip area. Next a clamp and feeder position alternate action switch button 176 at the front of the table is actuated and this results in operation of the air cylinder 43 to pivot the ribbon feed and cutoff assembly down into operation position. Also, the air cylinder 81 is operated to clamp the board to the *x-y* table and the air cylinders 95 and 105 are retracted to free the *x-y* table for movement. The microscope 34 includes a graduated reticle and the gradient is preset to the actual bond position of the bonding tips. Using this the operator fine positions the *x-y* table to the left by adjusting the thumb levers 32 and 33 to bring the circuit open in proper alignment with the right edge of the open on the proper mark on the reticle.

With the circuit open in position, a ribbon feed and cutoff alternate action switch button 177 at the front of the table is actuated to affect operation of the air cylinder 42 whereby the ribbon repair material is fed into position over the open and the ribbon cutoff blade 126 is moved to the open position. A check is made of the ribbon and further fine positioning of the *x-y* table is carried out if necessary. Next, the foot switch 166 is actuated to operate the air cylinder 156, solenoid coil 167 and the four-way valve 168 to carry out a bonding cycle, as described above, and the ribbon is bonded to the circuit line on the right side of the open. The foot switch is released and the ribbon feed and cut-off alternate action switch button is actuated again whereby the air cylinder 42 is retracted moving the ribbon clamp jaws 39 and 40 back to take a new bite on the ribbon and closing the cutoff blade 126 to cut the ribbon segment being bonded. The *x-y* table is now fine positioned to the right to bring the left free edge of the ribbon at the proper graduation on the reticle after which foot switch 166 is again actuated and the ribbon is bonded to the circuit line on the left side of the open. Upon completion of this, the clamp and feeder position alternate action switch button 176 is again actuated to retract the air cylinders 43 and 81 to raise the ribbon feed and cutoff assembly and lower the pressure disc - *x-y* table to unclamp the board.

Depending on the length of the open, it may happen that when fine positioning the *x-y* table for the second bonding operation the table cannot be moved far enough to the right to reach the desired position. To take care of this condition, there is provided on the control box a clamp and center alternate action switch button. Holding down the circuit board the operator may actuate this button to unclamp the board and center the table. A second actuation of the button will clamp the board and unlock the table to further positioning.

While the invention has been particularly shown and described with reference to a preferred embodiment thereof, it will be understood by those skilled in the art that various changes in form and details may be made therein without departing from the spirit and scope of the invention.

What is claimed is:

1. A semiautomatic method for repairing an open in a printed circuit line on a printed circuit board by thermal compression bonding comprising the steps of:
- clamping said circuit board to the surface of an adjustable *x-y* table;
- positioning said *x-y* table to place the circuit line on one side of said open in bonding position beneath bonding tips;
- feeding an amount of metallic ribbon material into position to bridge the open on said circuit line;
- causing said bonding tips to press against the ribbon and circuit line on said one side of the open;
- establishing a flow of current through said bonding tips and ribbon to bond the ribbon to the circuit line on said one side of the open;
- stopping said flow of current and removing said bonding tips from the ribbon and circuit line;
- cutting the ribbon material on the other side of the open;
- positioning the *x-y* table to place the circuit line and ribbon on the other side of said open in bonding position beneath the bonding tips;
- causing said bonding tips to press against the ribbon and circuit line on said other side of the open;
- establishing a second flow of current through said bonding tips and ribbon to bond the ribbon to the circuit line on said other side;
- stopping said second flow of current and removing said bonding tips from the ribbon and circuit line; and
- unclamping said circuit board from the *x-y* table.

2. A method as in claim 1 wherein the initiation of said current flow is controlled by the pressure of the bonding tips against the circuit board.

3. A method as in claim 1 wherein the circuit board is clamped by moving the *x-y* table against the underside of the board.

4. A method as in claim 1 wherein the ribbon is gripped and automatically slid into position to bridge the open and then automatically cut after the first bonding operation to leave an ungripped segment of ribbon which has one end bonded to the circuit line.

5. A method as in claim 1 wherein the *x-y* table is automatically adjusted to a center position prior to repairing another circuit line.

6. An apparatus for repairing an open in a printed circuit line on a printed circuit board by thermal compression bonding comprising:
- an adjustable *x-y* table;
- means for clamping said circuit board to the surface of said *x-y* table;
- a bonding unit having bonding tips adapted to carry out a thermal compression bonding operation;
- means for positioning said *x-y* table to place the circuit line on one side of said open in position under said bonding tips for a first bonding operation and later to place the circuit line on the other side of said open in position under the bonding tips for a second bonding operation;
- a supply of metallic repair ribbon material;

means for feeding an amount of said ribbon into position on said circuit line to bridge the open therein prior to the first bonding operation;

means for cutting the ribbon on said other side of the open after the first bonding operation and prior to the second bonding operation;

means for moving the bonding tips into pressure contact with the ribbon and circuit line for each bonding operation; and means responsive to a preset value of contact pressure of the bonding tips for controlling said bonding unit to establish a flow of current through said tips and ribbon whereby the ribbon segment bridging the open is bonded at each end to the circuit line.

7. An apparatus as in claim 6 and including second means responsive to a second preset value of contact pressure of the bonding tips for affecting the movement of the bonding tips away and out of contact with said ribbon.

8. An apparatus as in claim 6 wherein said clamping means comprises a vertically fixed clamping member and means for moving said *x-y* table and circuit board up against said member.

9. An apparatus for repairing an open in a printed circuit line on a printed circuit board by thermal compression bonding comprising:

an adjustable *x-y* table;

means for clamping said circuit board to the surface of said *x-y* table;

a bonding unit having bonding tips adapted to carry out a thermal compression bonding operation;

means for positioning said *x-y* table to place the circuit line on one side of said open in position under said bonding tips for a first bonding operation and later to place the circuit line on the other side of said open in position under the bonding tips for a second bonding operation;

a supply of metallic repair ribbon material;

a gripper jaw and cutoff blade mechanism for receiving and gripping said ribbon;

means for advancing said gripper jaw mechanism to slide an amount of said ribbon into position on said circuit line to bridge the open therein prior to the first bonding operation;

means for retracting said gripper jaw mechanism and operating said cutoff blade after the first bonding operation and prior to the second bonding operation whereby the ribbon is cut on said other side of the open and the gripper jaw mechanism takes a new bite of ribbon from said supply;

means for moving the bonding tips into pressure contact with the ribbon and circuit line for each bonding operation; and means responsive to a preset value of contact pressure of the bonding tips for controlling said bonding unit to establish a flow of current through said tips and ribbon whereby the ribbon segment bridging the open is bonded at each end to the circuit line.

10. An apparatus as in claim 9 wherein said last named means comprises a first pressure switch and a second pressure switch is provided which is responsive to a second preset value of contact pressure of the bonding tips for affecting the movement of the bonding tips away and out of contact with said ribbon.

11. An apparatus as in claim 10 wherein said second preset value of contact pressure is higher than said first preset value.

* * * * *